(12) United States Patent
Kronholz et al.

(10) Patent No.: US 8,361,858 B2
(45) Date of Patent: Jan. 29, 2013

(54) REDUCTION OF THICKNESS VARIATIONS OF A THRESHOLD SEMICONDUCTOR ALLOY BY REDUCING PATTERNING NON-UNIFORMITIES PRIOR TO DEPOSITING THE SEMICONDUCTOR ALLOY

(75) Inventors: Stephan Kronholz, Dresden (DE); Andreas Naumann, Dresden (DE); Gunda Beernink, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 134 days.

(21) Appl. No.: 12/693,227

(22) Filed: Jan. 25, 2010

(65) Prior Publication Data

US 2010/0193881 A1  Aug. 5, 2010

(30) Foreign Application Priority Data

Jan. 30, 2009  (DE) .................. 10 2009 006 886

(51) Int. Cl.
*H01L 21/8238* (2006.01)
(52) U.S. Cl. .................. 438/219; 257/24; 257/E21.436; 257/E21.632; 438/289; 438/300; 438/305
(58) Field of Classification Search .................. 438/301, 438/305, 199, 218, 219, 221, 289; 257/24, 257/E21.426, E21.632
See application file for complete search history.

(56) References Cited

U.S. PATENT DOCUMENTS

| 7,439,139 | B2 * | 10/2008 | Seliskar | 438/284 |
| 7,687,862 | B2 * | 3/2010 | Huebinger et al. | 257/369 |
| 2002/0001907 | A1 | 1/2002 | Weon et al. | 438/289 |
| 2003/0211713 | A1 * | 11/2003 | Suguro et al. | 438/481 |
| 2004/0129982 | A1 | 7/2004 | Oda et al. | 257/369 |
| 2006/0001108 | A1 * | 1/2006 | Yamamoto | 257/395 |
| 2006/0105533 | A1 | 5/2006 | Chong et al. | 438/322 |
| 2007/0181977 | A1 | 8/2007 | Lochtefeld et al. | 257/618 |
| 2008/0079086 | A1 | 4/2008 | Jung et al. | 257/369 |
| 2008/0099794 | A1 | 5/2008 | Beyer et al. | 257/255 |
| 2008/0237634 | A1 | 10/2008 | Dyer et al. | 257/190 |

FOREIGN PATENT DOCUMENTS

| DE | 10 2008 063 402 A1 | 7/2010 |
| EP | 0 936 676 A2 | 8/1999 |
| WO | WO 2006/083821 A1 | 8/2006 |

OTHER PUBLICATIONS

Translation of Official Communication from German Patent Office for German Patent Application No. 10 2009 006 886.4 dated Nov. 13, 2009.
PCT Search Report and Written Opinion from PCT/EP2010/000490 dated Apr. 27, 2010.
Translation of Official Communication from German Patent Office for German Patent Application No. 10 2009 006 886.4 dated May 14, 2012.
Windmann, D., et al.: Technologie Hochintegrierter Schaltungen, 2. Aufl., S. 186-189.

* cited by examiner

*Primary Examiner* — John C Ingham
(74) *Attorney, Agent, or Firm* — Williams, Morgan & Amerson (57) ABSTRACT

The growth rate in a selective epitaxial growth process for depositing a threshold adjusting semiconductor alloy, such as a silicon/germanium alloy, may be enhanced by performing a plasma-assisted etch process prior to performing the selective epitaxial growth process. For example, a mask layer may be patterned on the basis of the plasma-assisted etch process, thereby simultaneously providing superior device topography during the subsequent growth process. Hence, the threshold adjusting material may be deposited with enhanced thickness uniformity, thereby reducing overall threshold variability.

20 Claims, 7 Drawing Sheets

REDUCTION OF THICKNESS VARIATIONS OF A THRESHOLD SEMICONDUCTOR ALLOY BY REDUCING PATTERNING NON-UNIFORMITIES PRIOR TO DEPOSITING THE SEMICONDUCTOR ALLOY

BACKGROUND OF THE INVENTION

1. Field of the Invention

Generally, the present disclosure relates to sophisticated integrated circuits including advanced transistor elements that comprise highly capacitive gate structures including a metal-containing electrode and a high-k gate dielectric of increased permittivity compared to gate dielectrics, such as silicon dioxide and silicon nitride.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit elements that substantially determine performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits is fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although, generally, usage of high speed transistor elements having an extremely short channel may be restricted to high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may no longer be compatible with requirements for performance driven circuits.

Therefore, replacing silicon dioxide, or at least a part thereof, as the material for gate insulation layers has been considered, particularly for extremely thin silicon dioxide gate layers. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has thus been suggested to replace silicon dioxide with high permittivity materials, such as tantalum oxide ($Ta_2O_5$), with a k of approximately 25, strontium titanium oxide (SrTiO₃), having a k of approximately 150, hafnium oxide (HfO₂), HfSiO, zirconium oxide (ZrO₂) and the like.

When advancing to sophisticated gate architecture based on high-k dielectrics, additionally, transistor performance may also be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride, aluminum oxide and the like, may be formed so as to directly connect to the high-k dielectric material, thereby substantially avoiding the presence of a depletion zone. Since typically a low threshold voltage of the transistor, which represents the voltage at which a conductive channel forms in the channel region, is desired to obtain the high drive currents, commonly, the controllability of the respective channel requires sophisticated lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region to "reinforce" the resulting PN junction dopant gradient after the formation of respective extension and deep drain and source regions. In this way, the threshold voltage of the transistor significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll-off, and also reducing significant variations of transistor performance with a variation in gate length. Since the threshold voltage of the transistors is significantly affected by the work function of the gate material that is in contact with the gate dielectric material, an appropriate adjustment of the effective work function with respect to the conductivity type of the transistor under consideration has to be guaranteed.

For example, appropriate metal-containing gate electrode materials, such as titanium nitride, aluminum oxide and the like, may frequently be used, wherein the corresponding work function may be adjusted so as to be appropriate for one type of transistor, such as N-channel transistors, while P-channel transistors may require a different work function and thus a differently treated metal-containing electrode material in order to obtain the desired threshold voltage. In this case, complex and sophisticated manufacturing regimes may be required to provide different gate electrode materials in order to comply with the requirements of different transistor types. For this reason, it has also been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique, which may also present an additional complex process step, which, however, may provide reduced overall process complexity compared to the provision of the different metal-containing gate electrode materials or which may provide increased flexibility in obtaining appropriate transistor characteristics.

It turns out, however, that the manufacturing sequence for providing the threshold adjusting semiconductor alloy may have a significant influence on threshold variability across an active region, as will be explained in more detail with reference to FIGS. 1a-1f.

Figure 1A:
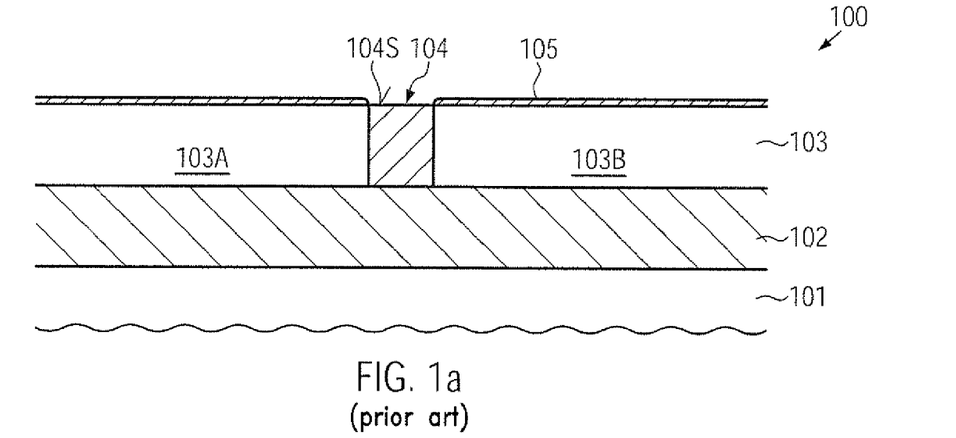
FIGS. 1a-1d schematically illustrate cross-sectional views during various manufacturing stages in selectively forming a silicon/germanium alloy on an active region of a P-channel transistor, according to conventional strategies.

FIG. 1a schematically illustrates a cross-sectional view of a semiconductor device 100 comprising a substrate 101, above which is formed a silicon-containing semiconductor material 103 having an appropriate thickness for forming therein and thereabove transistor elements. In the example shown, a buried insulating layer 102, for instance in the form of a silicon dioxide material, is positioned between the substrate 101 and the silicon-containing semiconductor layer 103. Moreover, an isolation structure 104, such as a shallow trench isolation, is formed in the semiconductor layer 103 to define a first crystalline "active" region 103A and a second active region 103B. In this context, an active region is to be understood as a semiconductor material in which an appropriate dopant profile is to be created in order to form PN junctions for one or more transistor elements. In the example shown, the first active region 103A may correspond to one or more P-channel transistors while the second active region 103B may correspond to one or more N-channel transistors. Furthermore, in the manufacturing stage shown, a silicon dioxide mask layer 105 is formed above the first and second active regions 103A, 103B, while typically the silicon dioxide material of the layer 105 may not be formed on the isolation structure 104, since typically the material of the layer 105 may be formed as a thermal oxide material.

The semiconductor device 100 as illustrated in FIG. 1a may typically be formed on the basis of the following process techniques. First, the isolation structure 104 is formed on the basis of well-established lithography, etch, deposition, planarization and anneal techniques in which, for instance, a trench is formed in the semiconductor layer 103 on the basis of a lithography process, which is subsequently filled with an appropriate insulating material such as silicon dioxide, silicon nitride and the like. After removing any excess material, further processing is typically continued by performing implantation sequences using an appropriate mask regime in order to introduce the appropriate dopant species for the active regions 103A, 103B. It should be appreciated that, although sophisticated planarization techniques may typically be used during the formation of the isolation structure 104, nevertheless a more or less pronounced surface topography may be obtained after the above-described process sequence so that the material of the active regions 103A, 103B may extend above the surface 104S of the isolation structure 104. Thereafter, the silicon dioxide 105 may be formed, for instance, by oxidation on the basis of appropriately selected process parameters in order to obtain a desired thickness of the layer 105, which may act as a growth mask during the further processing of the semiconductor device 100. That is, as previously discussed, the active region 103A has to be exposed prior to performing a selective epitaxial growth process for depositing a silicon/germanium alloy that may provide the required band gap offset or threshold voltage adjustment for corresponding P-channel transistors to be formed in and above the active region 103A.

Figure 1B:
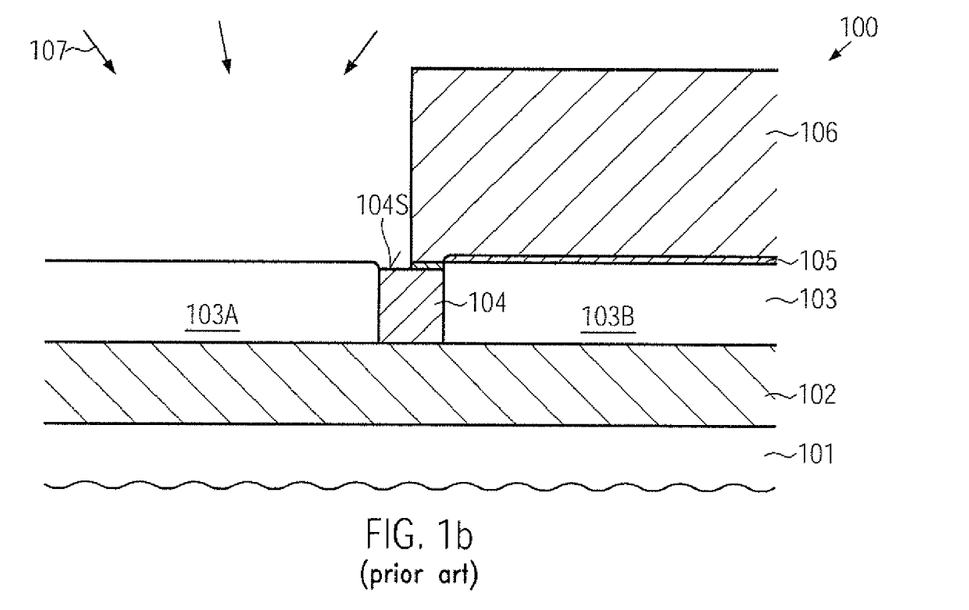

FIG. 1b schematically illustrates the semiconductor device in a further advanced manufacturing stage in which a resist mask 106 is formed above the second active region 103B. The resist mask may be formed by lithography techniques in accordance with similar recipes as may also be used for the masking regime when introducing the corresponding well dopant species into the active regions 103A, 103B. Thus, after patterning the resist mask 106, the active region 103A is exposed to a wet chemical etch ambient 107, which may be performed on the basis of hydrofluoric acid (HF), which may efficiently remove silicon dioxide selectively to silicon material. Thus, the exposed portion of the mask layer 105 is effectively removed wherein, however, the previously created surface topography with respect to the regions 103A, 103B and the isolation structure 104 may typically be maintained or may be even further increased. Next, a further wet chemical etch process is typically performed to remove the resist mask 106 on the basis of well-established etch recipes wherein, depending on the chemistry used, the resulting surface topography may further be increased.

Figure 1C:
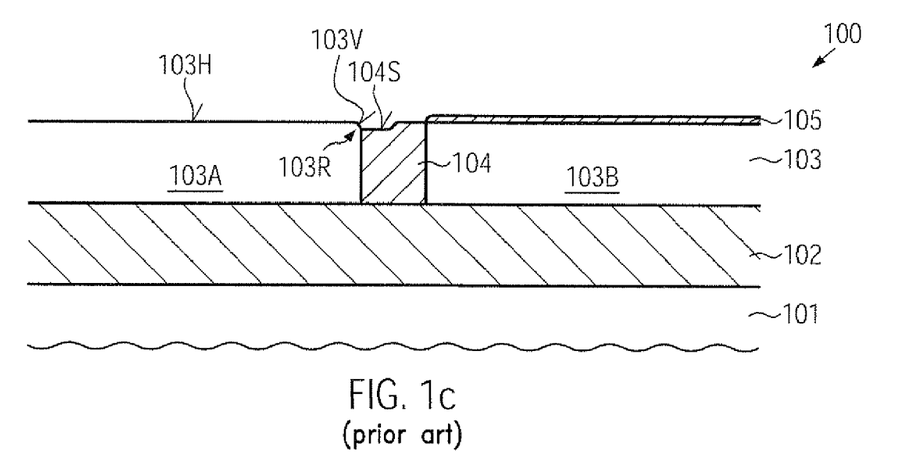

FIG. 1c schematically illustrates the semiconductor device 100 after the above-described process sequence and prior to actually depositing the silicon/germanium alloy on the exposed active region 103A. As illustrated, the moderately pronounced surface topography may result in the exposure of a horizontal surface portion 103H and also of a substantially vertical surface portion 103V, wherein both portions may act as deposition surface areas during the subsequent epitaxial growth process.

Figure 1D:
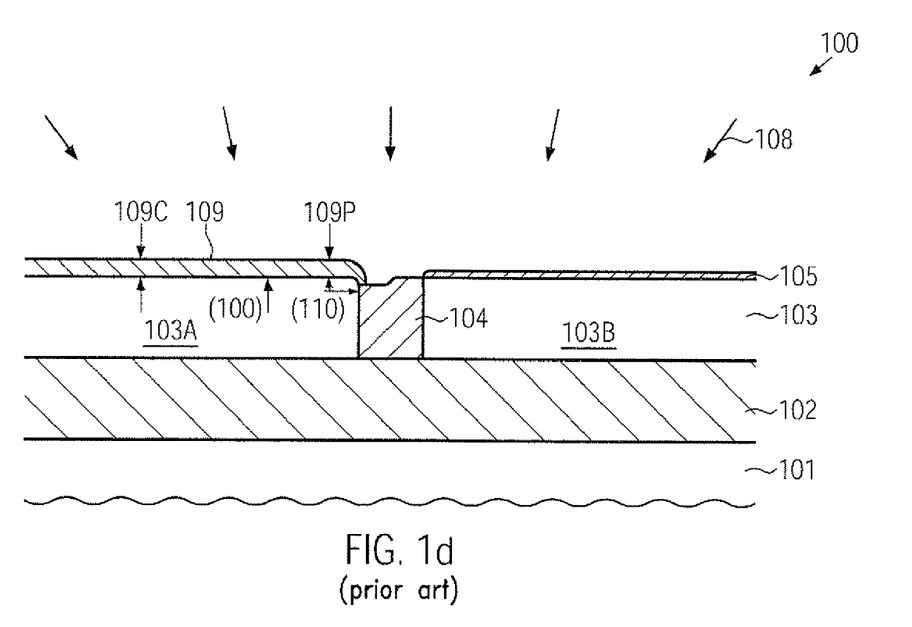

FIG. 1d schematically illustrates the semiconductor device 100 during a selective epitaxial growth process 108 in which process parameters are selected in accordance with well-established recipes such that a significant material deposition may be restricted to the exposed surface areas 103H, 103V (FIG. 1c), while a material deposition on dielectric surface areas, such as the isolation structure 104 and the silicon dioxide mask layer 105, may be negligible. Consequently, during the selective epitaxial growth process 108 a silicon/germanium alloy 109 may be selectively formed on the active region 103A, wherein the surface portions 103H, 103V may act as a template material. For instance, in sophisticated applications, the silicon/germanium alloy 109 may have to be provided with a desired target thickness, for instance of approximately 10 nm, when a germanium concentration of approximately 25 atomic percent is used. It should be appreciated that the material composition of the silicon/germanium alloy 109 as well as the thickness thereof may have a significant influence on the finally obtained threshold voltage and thus the finally obtained transistor characteristics. Although the material composition may be controlled with a high degree of accuracy, a significant degree of threshold variability may be observed in completed semiconductor devices, which is believed to be caused by a thickness variation in the silicon/germanium alloy. Without intending to restrict the present disclosure to any theory, it is nevertheless assumed that a difference of growth rate may occur during the deposition process 108, which may have its origin in the different crystallographic orientations of the exposed surface areas 103H, 103V. That is, as illustrated in FIG. 1d, the semiconductor layer 103 may be provided as a crystalline material having a surface orientation (100) while a transistor length direction and width directions are typically aligned with respect to the crystallographic <110> direction. Consequently, in particular at the area in the vicinity of the isolation structure 104, in which the surface portion 103V may have a substantially (110) orientation and in the area of a corresponding rounded portion 103R (see FIG. 1c), other crystallographic directions may be present, thereby resulting in an increased growth rate compared to central portions having substantially the (100) orientation. As a consequence, a thickness 109P at the periphery of the active region 103A may be greater compared to a thickness 109C in the center of the active region 103A, thereby possibly resulting in a threshold variability across the active region 103A.

Figure 1E:
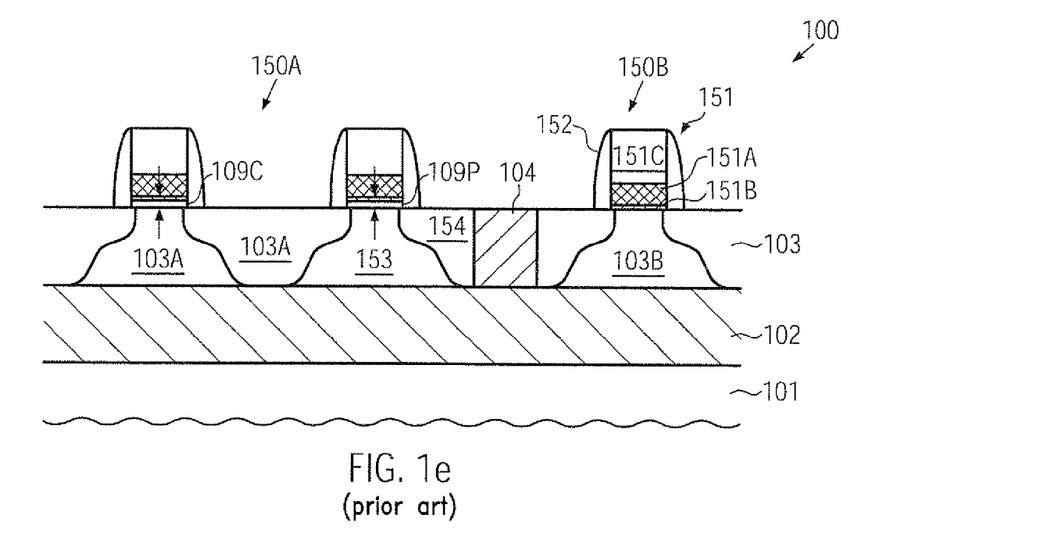
FIGS. 1e-1f schematically illustrate cross-sectional views of transistor elements formed on the basis of the preceding conventional process strategy, thereby obtaining a pronounced threshold voltage variability, which is believed to be caused by a non-uniformity of growth rates.

FIG. 1e schematically illustrates the semiconductor device 100 in a further advanced manufacturing stage. As illustrated, one or more P-channel transistors 150A are formed in and above the active region 103A on the basis of respective silicon/germanium alloys, which may be referred to as alloys 109C, 109P, since these materials may have a different thickness, as previously explained with reference to FIG. 1d. Furthermore, an N-channel transistor 150B is formed in and above the active region 103B. The transistors 150A, 150B comprise an electrode structure 151 including a gate insulation layer 151B, comprising a high-k dielectric material, as is previously explained. Furthermore, a metal-containing electrode material, such as aluminum oxide, titanium nitride and the like, may be formed on the gate insulation layer 151B, followed by a further electrode material, such as polysilicon 151C. As illustrated, in the P-channel transistors 150A, the gate insulation layers 151B are formed on the corresponding silicon/germanium alloys 109C, 109P, respectively, so that a threshold voltage of the transistors 150A, i.e., the voltage at which a conductive channel forms in a channel region 153, may be determined by the characteristics of the alloys 109C, 109P and the materials 151B and 151A in combination with the corresponding characteristics of drain and source regions 154, which may also be formed on the basis of sophisticated dopant profiles, as previously explained. On the other hand, the band gap configuration of the channel region 153 of the N-channel transistor 150B is appropriate for the corresponding materials 151B, 151A of the transistor 150B. Thus, in this configuration, although the silicon/germanium alloy may be formed on the basis of a specifically selected target thickness, which may result in substantially the same threshold voltages for transistors 150A, the previously occurring deposition non-uniformity may thus contribute to a corresponding difference in transistor characteristics, even if the remaining manufacturing processes for forming the gate electrode structure 151 and the drain and source regions 154 may be performed with a high degree of process uniformity.

Figure 1F:
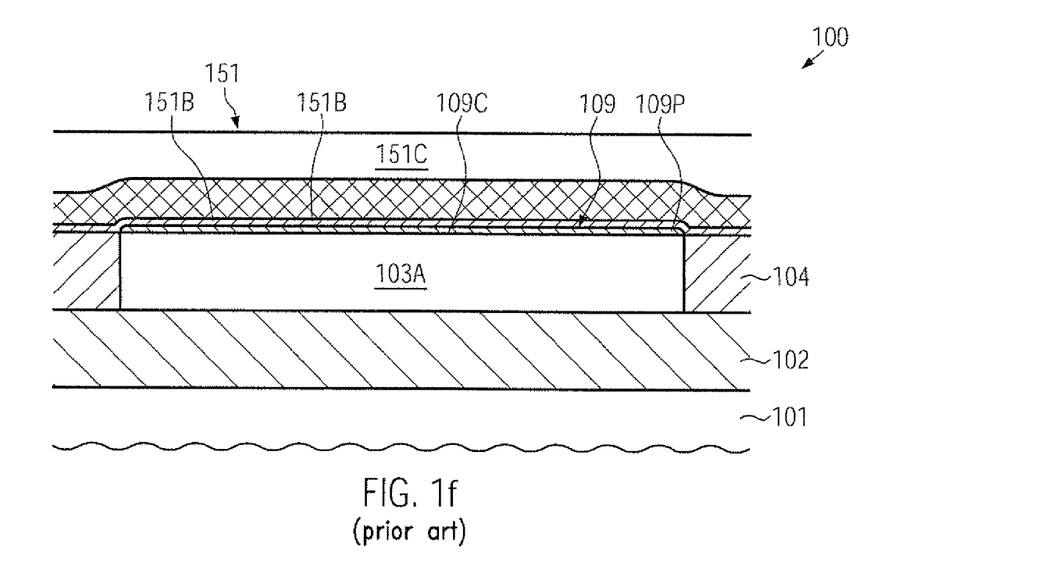

FIG. 1f schematically illustrates a cross-sectional view in order to depict a P-channel transistor, such as one of the transistors 150A of FIG. 1e, along a transistor width direction. Thus, as illustrated, the gate electrode structure 151 may extend across the entire active region 103A and may also be formed above a portion of the isolation structure 104. Due to the deposition non-uniformities previously described, the silicon/germanium alloy 109 may comprise the peripheral portion 109P and the central portion 109C, which may thus differ in thickness, as discussed above. Consequently, also within a single transistor element, a pronounced thickness variation of the silicon/germanium alloy may exist so that an overall threshold voltage may be obtained that may be difficult to be predicted due to the varying thickness of the silicon/germanium alloy 109. Moreover, for a difference in transistor width of various active regions, a further pronounced threshold variability may occur since, for an increased overall transistor width, the edge effect at the isolation structure 104 may be less pronounced compared to a transistor active region having a reduced width. Consequently, the dependence of the threshold voltage on the transistor width may be significantly increased due to the thickness variation of the silicon/germanium material, even within a single transistor element, thereby contributing to a significant overall device variability, which may not be compatible with performance requirements of sophisticated semiconductor devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides methods and semiconductor devices in which threshold variability may be reduced by enhancing the surface topography of active semiconductor regions prior to performing a selective epitaxial growth process. To this end, material of the active region under consideration may be removed in a highly controllable manner so as to significantly reduce the growth rate variability during the subsequent epitaxial growth process. For this purpose, in some illustrative embodiments, plasma assisted etch recipes may be used, for instance in the context of patterning growth masks, thereby obtaining reduced pronounced surface topography, which may thus provide enhanced uniformity during the epitaxial growth process.

One illustrative method disclosed herein comprises forming a mask layer on a first silicon-containing crystalline semiconductor region and a second silicon-containing crystalline semiconductor region, wherein the first and second silicon-containing semiconductor regions are laterally separated by an isolation region. The method further comprises removing the mask layer selectively from the first silicon-containing crystalline semiconductor region while maintaining the mask layer on the second silicon-containing crystalline semiconductor region. Furthermore, the first silicon-containing crystalline semiconductor region is recessed and a threshold adjusting semiconductor alloy is selectively formed on the recessed first silicon-containing crystalline semiconductor region. The method further comprises forming a first gate electrode structure of a first transistor above the threshold adjusting semiconductor alloy and forming a second gate electrode structure of a second transistor above the second silicon-containing crystalline semiconductor region.

A further illustrative method disclosed herein comprises exposing a surface of an active semiconductor region that is laterally enclosed by an isolation structure wherein any exposed surface areas of the exposed surface have substantially the same crystalline orientation. Moreover, the method comprises forming a threshold adjusting semiconductor material on the exposed surface by performing a selective epitaxial growth process. Finally, the method comprises forming a gate electrode structure of a transistor on the threshold adjusting semiconductor material wherein the gate electrode structure comprises a high-k dielectric material and a metal-containing electrode material formed on the high-k dielectric material.

One illustrative semiconductor device disclosed herein comprises an active silicon-containing semiconductor region and an isolation structure laterally enclosing the active silicon-containing semiconductor region, wherein the isolation structure has a first edge and a second edge that define a width of the active silicon-containing semiconductor region. The semiconductor device further comprises a threshold adjusting semiconductor alloy formed on the active silicon-containing semiconductor region and extending from the first edge to the second edge and having a thickness with a variation of approximately 5 percent or less. Moreover, the semiconductor device comprises a gate electrode structure comprising a high-k gate insulation layer and a metal-containing electrode material that is formed on the high-k gate insulation layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Basically, the present disclosure provides semiconductor devices and techniques in which sophisticated gate electrode structures may be formed in an early manufacturing stage on the basis of a high-k dielectric material and a metal-containing electrode material. The threshold voltage of one type of transistor may, therefore, be adjusted by providing an appropriate semiconductor material in the channel region of the corresponding transistors, which may be accomplished by manufacturing process techniques with enhanced uniformity, thereby reducing the threshold variability compared to conventional strategies, as previously described. For this purpose, the surface topography of the exposed active region may be enhanced in order to reduce the number of different crystallographic orientations, which may typically be present at the edge of active regions when a more or less pronounced surface topography has been generated during the preceding manufacturing processes. That is, by removing material of the exposed active region in a highly controllable manner, that is, in some illustrative embodiments, on the basis of a plasma-assisted etch process, a certain degree of recessing may be accomplished, thereby also reducing the amount of undesired surface areas, such as substantially vertical surface or sidewall portions at the periphery of the exposed active region. Consequently, the influence of undesired crystallographic orientations on the growth rate during the selective epitaxial growth process may be reduced, thereby reducing the difference in thickness between central areas and peripheral areas of the epitaxially grown semiconductor material. It should be appreciated that the term "thickness variability or uniformity" as used herein may be defined on the basis of thickness of the semiconductor alloy in the center of an active region under consideration by determining a percentage of deviation from this "reference" thickness at the periphery of the active region. For instance, a thickness of 10 nm at the center of the active region and a thickness of 12 nm at the periphery thereof may correspond to a thickness variability of 20 percent.

In some illustrative embodiments disclosed herein, the highly controllable material removal in the active region may be accomplished during a plasma-assisted etch process for patterning a mask layer, thereby maintaining a high degree of process efficiency with respect to the conventional strategy, as previously described. For example, silicon nitride may be used as an efficient mask material which may be efficiently etched on the basis plasma-assisted etch chemistries using chlorine or fluorine-based recipes, as are well established in the art. In other illustrative embodiments, an additional material removal may be applied, if desired, for instance on the basis of well controllable wet chemical etch processes and the like. Consequently, based on the previous plasma-assisted etch process, any desired degree of recessing may be applied without contributing to pronounced growth non-uniformities, as is typically caused in conventional strategies.

With reference to FIGS. 2$a$-2$j$, further illustrative embodiments will now be described in more detail, wherein reference may also be made to FIGS. 1$a$-1$f$, if required.

FIG. 2$a$ schematically illustrates a cross-sectional view of a semiconductor device 200 comprising a substrate 201 and a silicon-containing semiconductor region 203, which may be in a substantially crystalline state. Furthermore, in some illustrative embodiments, as is, for instance, shown in FIG. 2$a$, at least a portion of the device 200 may be formed on the basis of an SOI architecture in which a buried insulating layer 202 is positioned between the substrate 201 and the semiconductor layer 203. It should be appreciated, however, that the principles disclosed herein may also be readily applied to a bulk configuration in which the buried insulating layer 202 may be omitted, at least in some device areas of the semiconductor device 200. Furthermore, an isolation structure 204, such as a shallow trench isolation, may be provided in the semiconductor layer 203, thereby defining a first active region 203A and a second active region 203B. As previously explained with reference to the device 100, the active regions 203A, 203B may comprise a basic dopant profile for defining the conductivity type of corresponding transistors still to be formed in and above the active regions 203A, 203B. In one illustrative embodiment, the active region 203A may represent an N-doped region in order to form one or more P-channel transistors therein. Similarly, the active region 203B may represent the active region of one or more N-channel transistors. In the following, a manufacturing sequence will be described in which a threshold adjusting semiconductor alloy may be selectively formed on the active region 203A in order to provide a corresponding threshold voltage for one or more transistors to be formed therein. It should be appreciated, however, that corresponding mechanisms for adjusting the threshold voltage may also be applied to any transistor to be formed in and above the active region 203B or to both active regions 203A, 203B, depending on the overall device and process requirements. Furthermore, in the manufacturing stage shown, a mask layer 205 may be formed above the active regions 203A, 203B with an appropriate thickness, for instance with a thickness in the range of approximately 10 nm or less. In one illustrative embodiment, the mask layer 205 may be comprised of silicon nitride which may be formed in a highly controllable manner on the basis of well-established deposition recipes. In other illustrative embodiments, the mask layer 205 may be comprised of other materials, which may be selectively removed with respect to material of the active region 203A and the isolation structure 204 by using a plasma-assisted etch recipe. For instance, silicon carbide, nitrogen-containing silicon carbide and the like represent appropriate materials that may be used for forming the mask layer 205.

Figure 2A:
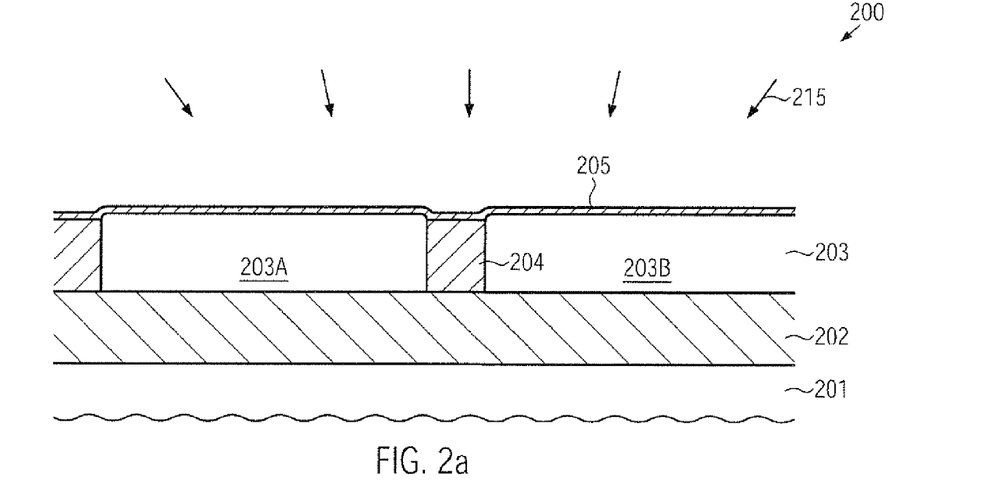
FIGS. 2a-2b schematically illustrate cross-sectional views of a semiconductor device during the deposition and patterning of a mask material wherein the patterning may be accomplished on the basis of a plasma-assisted etch process, according to illustrative embodiments.

The semiconductor device 200 may be formed on the basis of well-established process techniques, as also previously described with reference to the device 100, when the active regions 203A, 203B and the isolation structure 204 are considered. As previously discussed, during the corresponding manufacturing sequence, a more or less pronounced surface topography may be generated. Thereafter, the mask layer 205 may be formed on the basis of a deposition process 215, such as a thermally activated chemical vapor deposition (CVD) process, a plasma-assisted deposition process and the like. It should be appreciated that a plurality of deposition recipes are well established in the art so as to form a material layer, such as silicon nitride, silicon carbide and the like, with a desired thickness in the above-specified range with a high degree of uniformity.

Figure 2B:
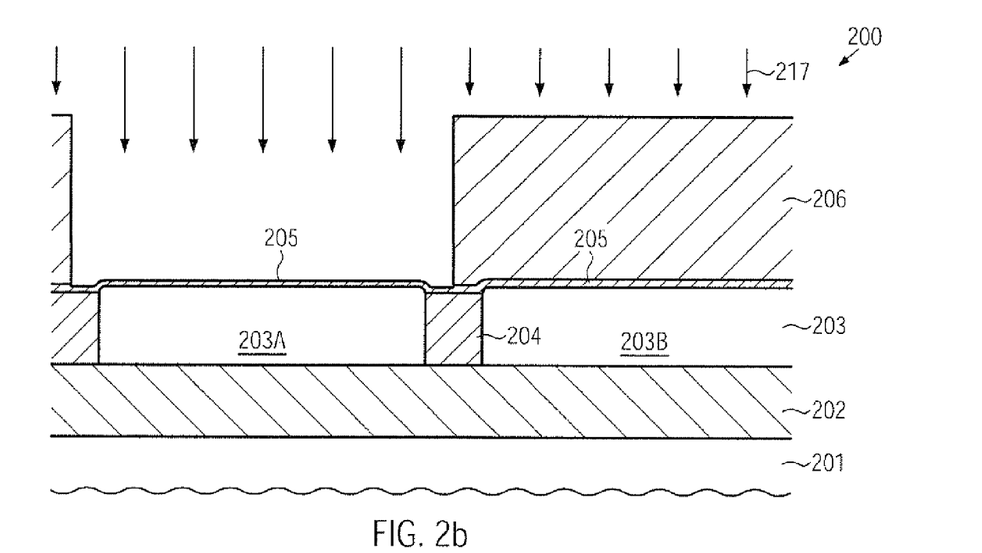

FIG. 2b schematically illustrates the semiconductor device 200 in a further advanced manufacturing stage. As illustrated, an etch mask 206, such as a resist mask, is formed in such a manner that the mask layer 205 above the active region 203B may be covered, while the portion of the mask layer 205 formed above the active region 203A may be exposed to a plasma-assisted etch ambient 217. As previously explained, the etch mask 206 may be formed on the basis of well-established photolithography techniques. Thereafter, the plasma-assisted ambient of the etch process 217 may be established, for instance on the basis of appropriate etch recipes and process parameters, wherein a plurality of chlorine and fluorine-based chemistries are available for silicon nitride, silicon carbide and the like, in a selective manner with respect to the isolation structure 204 and the material of the active region 203A. Thus, during the etch process 217, material of the layer 205 may be increasingly removed, wherein finally during the advance of the etch front the active region 203A may be exposed and may also interact with the etch ambient 217, however, at a significantly reduced degree compared to the material of the mask layer 205. Consequently, due to the anisotropic nature of the etch process 217, a certain degree of recessing of the active region 203A may be accomplished without contributing to a pronounced corner rounding, as may typically occur on the basis of wet chemical etch recipes, as previously discussed.

Figure 2C:
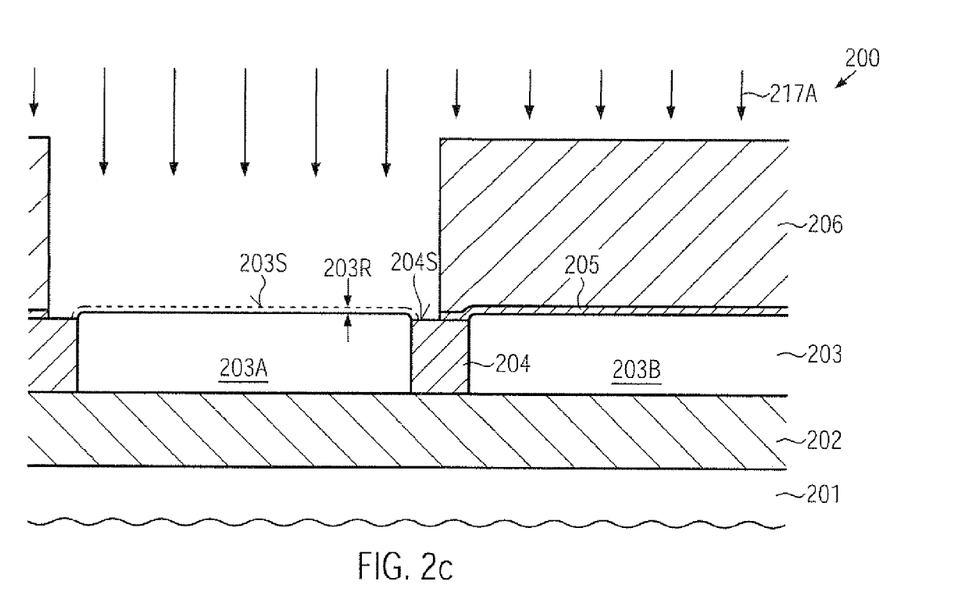
FIG. 2c schematically illustrates the semiconductor device during the manufacturing phase in which a certain degree of material removal and thus recessing of the active region may be accomplished, thereby enhancing surface topography prior to selective epitaxial growth process, according to further illustrative embodiments.

FIG. 2c schematically illustrates the semiconductor device 200 in a further advanced stage. As illustrated, a certain degree of recessing or thickness reduction, indicated as 203R, may be created, thereby enhancing the overall surface topography, i.e., reducing the height difference between the surface 203S and the surface 204S of the isolation region 204. As explained with reference to FIG. 2b, in some illustrative embodiments, the recess 203R may be accomplished on the basis of the etch process 217 (FIG. 2b), for instance by appropriately selecting an etch time of the process 217 wherein appropriate values may be obtained on the basis of test runs and the like. In other illustrative embodiments, an additional plasma-assisted etch process 217A may be performed after substantially completely removing the exposed portion of the mask layer 205, when the etch behavior of the material of the active region 203A is considered inappropriate with respect to the etch chemistry of the process 217 of FIG. 2b. Also, in these embodiments, the recess 203R may be obtained in a highly controllable manner, thereby reducing the height difference between the region 203A and the isolation structure 204, thereby also providing a reduced degree of variability with respect to crystallographic orientations at the periphery of the active region 203A, as previously explained.

Figure 2D:
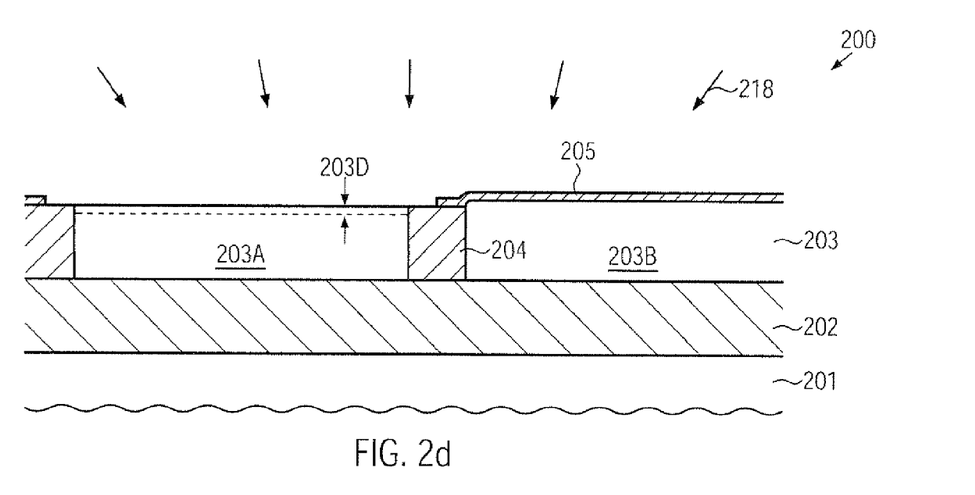
FIGS. 2d-2e schematically illustrate cross-sectional views of the device during further manufacturing steps for forming a threshold adjusting semiconductor alloy, according to illustrative embodiments.

FIG. 2d schematically illustrates the semiconductor device 200 when subjected to an etch sequence 218, which may include appropriate etch steps for removing contaminants, such as etch byproducts created during the preceding etch process or processes 217, 217A and which may also include etch steps for removing the etch mask 206 (FIG. 2c). For example, the etch sequence 218 may be performed on the basis of hydrofluoric acid (HF) for cleaning exposed surface areas, wherein prior to or after, if desired, a dedicated etch chemistry may be applied to remove the etch mask 206 (FIG. 2c). In some illustrative embodiments, the etch sequence 218 may further comprise a specific etch step for increasing the degree of recessing, as indicated by 203D, wherein a desired "anisotropic" etch behavior may be accomplished due to the preceding plasma-assisted etch step(s). That is, further to the preceding recessing of the material of the active region 203A, a further etch step, even when exhibiting basically an isotropic behavior, may result in a uniform material removal, even at the vicinity of the isolation structure 204. For example, well-controllable and very selective etch recipes are available, for instance based on tetra methyl ammonium hydroxide (TMAH), which basically represents a chemical agent for etching resist material which, however, may also be used for etching silicon material in higher concentrations at elevated temperature, wherein a high degree of selectivity with respect to silicon dioxide, silicon nitride and the like may also be achieved. Consequently, based on the corresponding etch chemistry, the further recessing 203D, if desired, may be accomplished, for instance, such that a corresponding thickness of the semiconductor alloy still to be formed may be compensated for in view of enhancing overall process uniformity.

Figure 2E:
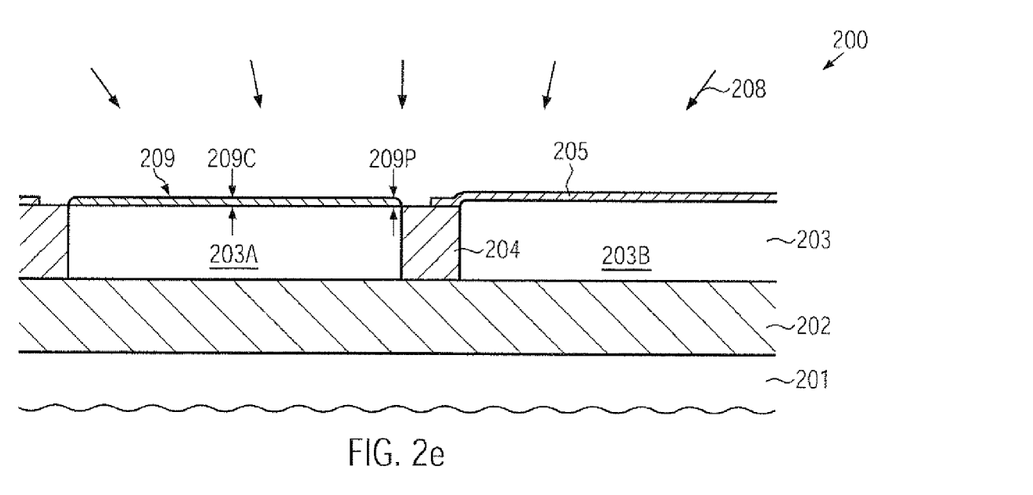

FIG. 2e schematically illustrates the semiconductor device 200 when exposed to a deposition ambient 208, which is appropriately designed to selectively deposit a threshold adjusting semiconductor alloy 209 on the active region 203A. For instance, the semiconductor alloy 209 may comprise a silicon/germanium alloy with an appropriate germanium fraction, such as 20 atomic percent or higher, depending on the overall device requirements. As previously explained, the resulting band gap offset obtained by the material 209 may depend on the material composition and the thickness. Hence, for both parameters, appropriate target values may be selected in order to obtain the desired threshold voltage. Due to the enhanced surface topography, the variability in growth rate during the process 208 may be significantly reduced, thereby obtaining a thickness 209P at the periphery of the active region 203A that may exhibit a significantly reduced degree of deviation from a thickness 209C at the center. In this respect, the variability in thickness of the material 209 may be approximately 5 percent and less, for instance, in some illustrative embodiments, a thickness variability of approximately 3 percent and less may be accomplished, while, in other cases, the variability may be 2 percent and less. It should be appreciated that the thickness variability may be understood in the above-defined sense. Consequently, for instance, for a target thickness of 9 nm of a silicon/germanium alloy having a germanium fraction of 25 atomic percent, the corresponding difference between the peripheral thickness 209P and the central thickness 209C may be less than approximately 0.45 nm, while, in other cases, an even further enhanced uniformity may be accomplished.

It should be appreciated that other semiconductor alloys may be used, if required, by corresponding threshold adjusting mechanisms, wherein any such materials may also be provided with enhanced uniformity due to the reduction of corresponding edge effects during the deposition that may be caused by the difference in growth rate of different crystallographic orientations, as previously explained.

Figure 2F:
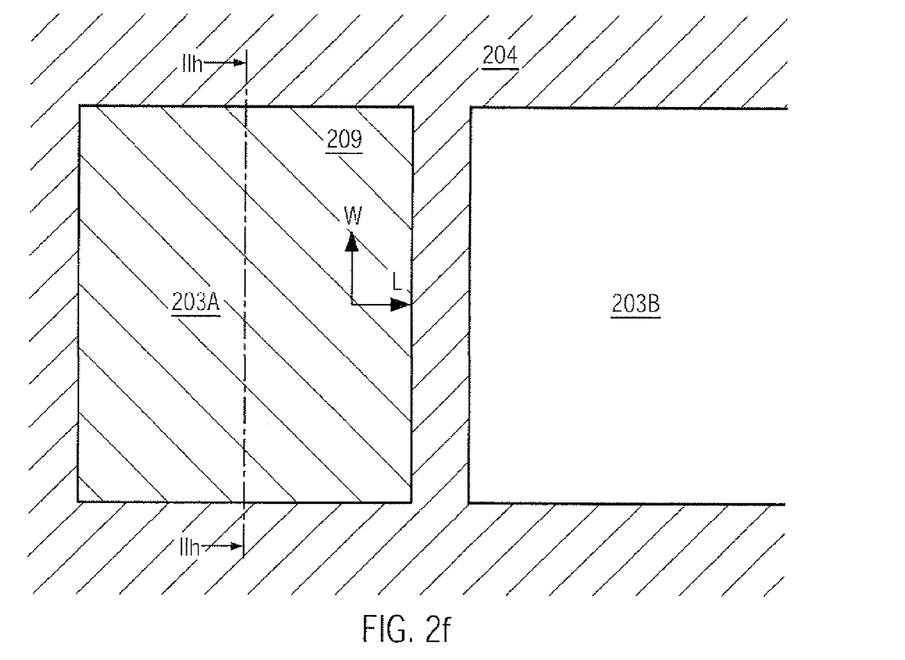
FIG. 2f schematically illustrates a top view of the semiconductor device after the epitaxial growth of the threshold adjusting semiconductor alloy.

FIG. 2f schematically illustrates a top view of the semiconductor device 200 after the deposition of the semiconductor alloy 209 and the removal of the mask layer 205 (FIG. 2e). As is evident from FIG. 2f, due to the superior thickness uniformity of the semiconductor alloy 209, an enhanced uniformity may be accomplished along a length direction, indicated as L, and also along a width direction, indicated as W. Consequently, a corresponding threshold variability of transistor elements, which may be formed in and above the active region 203A, may be reduced, while the thickness variability within a single transistor element along the width direction may also be reduced.

Figure 2G:
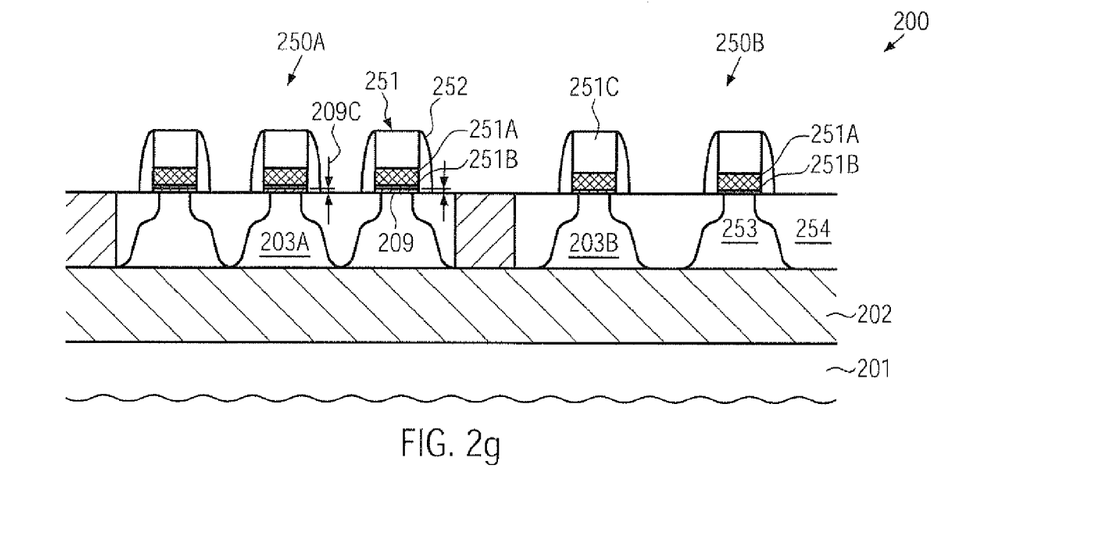
FIGS. 2g-2h schematically illustrate cross-sectional views of the semiconductor device in a very advanced manufacturing stage in which sophisticated gate electrode structures including a high-k gate insulation material may be formed on the basis of the threshold adjusting semiconductor alloy having a reduced degree of thickness variability, according to still further illustrative embodiments.

FIG. 2g schematically illustrates a cross-sectional view of the semiconductor device 200 along the transistor length direction, which in FIG. 2g corresponds to the horizontal direction. As illustrated, a plurality of transistors 250A, such as P-channel transistors, may be formed in and above the active region 203A, while one or more transistors 250B may be formed in and above the active region 203B. The transistors 250A, 250B may have a similar configuration as previously described with reference to the device 100. That is, the transistors 250A, 250B may comprise a gate electrode structure 251 including a gate insulation layer 251B, a metal-containing electrode material 251A directly formed on the gate insulation layer 251B, followed by a further electrode material 251C, such as a polysilicon material, metal silicide and the like. Moreover, in the transistors 250A, the gate insulation layers 251B may be formed on the threshold adjusting semiconductor alloy 209 so as to obtain a desired threshold voltage for a channel region 253, which comprises the alloy 209 in the transistors 250A. Due to the superior thickness uniformity of the semiconductor alloy 209, the transistors 250A may exhibit a very similar threshold voltage, thereby contributing to overall uniformity of the device 200 with respect to performance and reliability.

With respect to any manufacturing techniques for forming the transistors 250A, 250B, the appropriate manufacturing regime may be used. The gate electrode structures 251 may be formed by depositing an appropriate gate dielectric, which may comprise conventional dielectrics in combination with high-k materials, followed by the deposition of the metal-containing electrode material 251A, for instance in the form of aluminum oxide, titanium nitride and the like. Thereafter, any further appropriate material, such as polysilicon, may be deposited and subsequently the layer structure may be patterned on the basis of sophisticated lithography techniques. Thereafter, the dopant profiles for drain and source regions 254 may be obtained on the basis of sophisticated implantation techniques, for instance using a sidewall spacer structure 252. Thereafter, the device 200 may be annealed in order to activate dopant and re-crystallize implantation-induced damage.

Figure 2H:
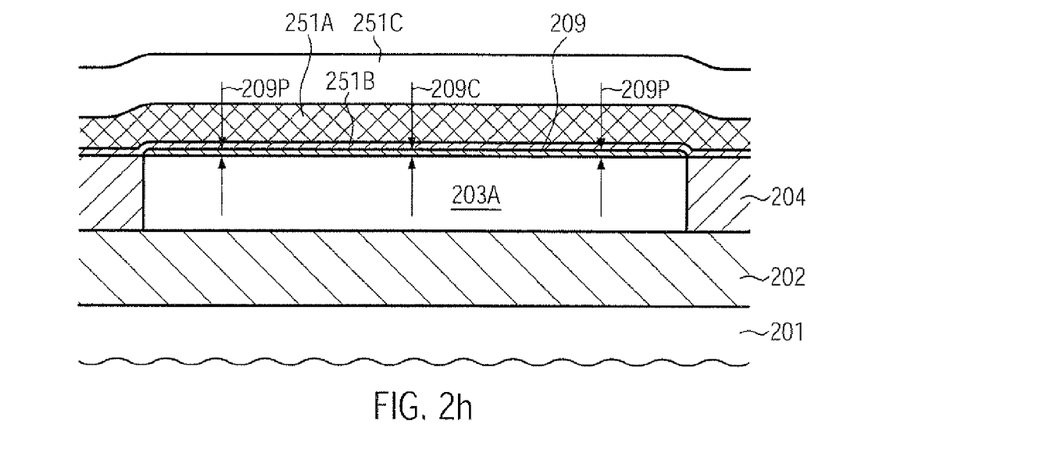

FIG. 2h schematically illustrates the semiconductor device 200 according to a cross-sectional view along a transistor width direction, which corresponds to the horizontal direction of FIG. 2h. For example, the cross-section may be made through one of the transistors 250A when a plurality of transistors are formed in and above the active region 203A. In other cases, a single transistor may be formed in and above the active region 203A and the cross-section may be made through the gate electrode structure along the width direction. Thus, the transistor 250A may comprise the threshold adjusting semiconductor alloy 209 on which is to be formed the gate insulation layer 251B, followed by the metal-containing electrode material 251A and the further gate material 251C. Due to the significantly reduced difference in thickness of the semiconductor alloy 209, i.e., the thickness values 209P, 209C may have reduced variability within the above-specified range, the overall threshold voltage of the transistor 250A may be defined with enhanced accuracy and predictability, while at the same time the dependency of threshold variability on transistor width for transistor devices of different width may be significantly reduced.

As a result, the present disclosure provides semiconductor devices and techniques in which enhanced uniformity of the growth rate of a selective epitaxial growth process may be accomplished so that a threshold adjusting semiconductor alloy may be provided with a significantly reduced thickness variability and reduced variability with respect to material composition at an early manufacturing stage. Thus, sophisticated gate electrode structures comprising a high-k gate dielectric in combination with a metal-containing electrode material may be formed prior to forming drain and source regions, thereby providing a high degree of compatibility with well-established CMOS techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a mask layer above a first silicon-containing crystalline semiconductor region and a second silicon-containing crystalline semiconductor region, said first and second silicon-containing crystalline semiconductor regions being laterally separated by an isolation region;
    removing said mask layer selectively from above said first silicon-containing crystalline semiconductor region while maintaining said mask layer above said second silicon-containing crystalline semiconductor region;
    etching said first silicon-containing crystalline semiconductor region to reduce a height difference between the first silicon-containing crystalline semiconductor region and the isolation region;
    forming a threshold adjusting semiconductor alloy selectively on said first silicon-containing crystalline semiconductor region of reduced thickness;
    forming a first gate electrode structure of a first transistor above said threshold adjusting semiconductor alloy; and
    forming a second gate electrode structure of a second transistor above said second silicon-containing crystalline semiconductor region.

2. The method of claim 1, wherein forming said first and second gate electrode structures comprises forming a high-k dielectric gate insulation layer and forming a metal-containing electrode material on said high-k gate insulation layer.

3. The method of claim 1, wherein forming said mask layer comprises forming a silicon nitride layer.

4. The method of claim 3, wherein etching said first silicon-containing crystalline semiconductor region performing a wet chemical etch process after removing said mask layer selectively from said first silicon-containing crystalline semiconductor region.

5. The method of claim 4, further comprising removing a resist mask used to selectively remove said mask layer.

6. The method of claim 4, wherein a thickness of said first silicon-containing crystalline semiconductor region is reduced on the basis of said wet chemical etch process.

7. The method of claim 6, wherein performing said wet chemical etch process comprises using tetra methyl ammonium hydroxide (TMAH).

8. The method of claim 1, wherein removing said mask layer selectively from said first silicon-containing crystalline semiconductor region comprises performing a plasma-assisted etch process.

9. The method of claim 8, wherein etching said first silicon-containing crystalline semiconductor region comprises reducing a thickness of said first silicon-containing crystalline semiconductor region during said plasma-assisted etch process.

10. The method of claim 1, wherein forming said threshold adjusting semiconductor alloy comprises performing a selective epitaxial growth process so as to suppress material deposition on said isolation structure and on said mask layer formed above said second silicon-containing crystalline semiconductor region.

11. The method of claim 10, wherein said threshold adjusting semiconductor alloy comprises a silicon/germanium alloy.

12. A method, comprising:
exposing a surface of an active semiconductor region that is laterally enclosed by an isolation structure, any exposed surface areas of said exposed surface having substantially the same crystalline orientation, wherein exposing the surface comprises reducing a height difference between the active semiconductor region and the isolation region using an etch process;
forming a threshold adjusting semiconductor material on said exposed surface by performing a selective epitaxial growth process; and
forming a gate electrode structure of a transistor on said threshold adjusting semiconductor material, said gate electrode structure comprising a high-k dielectric material and a metal-containing electrode material formed on said high-k dielectric material.

13. The method of claim 12, wherein exposing said surface comprises removing material of said active semiconductor region that extends above a surface of said isolation structure to reduce the height difference between the active semiconductor region and the isolation region.

14. The method of claim 13, wherein removing material of said active semiconductor region using the etch process comprises performing a plasma-assisted etch process.

15. The method of claim 14, further comprising forming a mask layer above said active semiconductor region and selectively removing said mask layer from said active region on the basis of said plasma-assisted etch process, while maintaining said mask layer above a further active region.

16. The method of claim 15, wherein said mask layer comprises silicon nitride.

17. The method of claim 15, wherein said mask layer is formed with a thickness of approximately 10 nm or less.

18. The method of claim 14, further comprising performing a wet chemical etch process after exposing said surface.

19. The method of claim 18, wherein said wet chemical etch process is performed on the basis of hydrofluoric acid (HF).

20. The method of claim 12, wherein said threshold adjusting semiconductor material comprises a silicon/germanium alloy.

* * * * *